(12) United States Patent
Sakurai et al.

(10) Patent No.: US 7,266,035 B2
(45) Date of Patent: Sep. 4, 2007

(54) SELF-ALIGNED ROW-BY-ROW DYNAMIC VDD SRAM

(75) Inventors: Takayasu Sakurai, Setagaya-ku (JP); Hiroshi Kawaguchi, Koto-ku (JP); Robert Saliba Fayez, Setagaya-ku (JP)

(73) Assignee: Semiconductor Technology Academic Research Center, Kanagawa (JP)

( * ) Notice: Subject to any disclaimer, the term of this patent is extended or adjusted under 35 U.S.C. 154(b) by 0 days.

(21) Appl. No.: 11/205,466

(22) Filed: Aug. 16, 2005

(65) Prior Publication Data

US 2006/0039182 A1 Feb. 23, 2006

(30) Foreign Application Priority Data

Aug. 20, 2004 (JP) ............................. 2004-241357

(51) Int. Cl.
*G11C 7/00* (2006.01)

(52) U.S. Cl. .................. 365/226; 365/230.06; 365/154

(58) Field of Classification Search ................. 365/226
See application file for complete search history.

(56) References Cited

U.S. PATENT DOCUMENTS 6,301,146 B1 * 10/2001 Ang et al. .................. 365/154

2004/0042326 A1 * 3/2004 Ashizawa ................... 365/232
2004/0246805 A1 * 12/2004 Nii ............................. 365/226

OTHER PUBLICATIONS

Mai, K.W., et al., "Low-Power SRAM Design Using Half-Swing Pulse-Mode Techniques," *IEEE Journal of Solid-State Circuits* 33(11):1659-71, Nov. 1998.

* cited by examiner

*Primary Examiner*—Thong Q. Le
(74) *Attorney, Agent, or Firm*—Christensen O'Connor Johnson Kindness PLLC

(57) ABSTRACT

A memory cell array includes a plurality of memory cells arranged in a matrix form. A word line and a power supply line respectively are connected in common to the plurality of memory cells arranged in each row. A power supply line/word line control circuit is connected to each word line and each power supply line. In accessing the plurality of memory cells row by row, the control circuit raises the voltage of the power supply line and, after the voltage of the power supply line reaches the high voltage at all the positions, starts activation of the word line. On the other hand, in turning from the access state to the non-access state, the control circuit deactivates the word line and, after the voltage of the word line changes to the ground voltage at all the positions, changes the voltage of the power supply line to the low voltage.

5 Claims, 4 Drawing Sheets

SELF-ALIGNED ROW-BY-ROW DYNAMIC VDD SRAM

CROSS-REFERENCE TO RELATED APPLICATIONS

This application is based upon and claims the benefit of priority from prior Japanese Patent Application No. 2004-241357, filed Aug. 20, 2004, the entire contents of which are incorporated herein by reference.

BACKGROUND OF THE INVENTION

1. Field of the Invention

The present invention relates to a static random access memory (SRAM), and more particularly to an SRAM in which the value of the power supply voltage supplied to memory cells at non-access time is set to be lower than the value of the power supply voltage supplied to the memory cells at access time.

2. Description of the Related Art

Recently, an SRAM is being developed having low power consumption and high performance. Particularly, as an SRAM realizing low power consumption, an SRAM with a row-by-row dynamic VDD (RRDV) controlling method is disclosed, for example, in Kenneth W. Mai et al. "Low-Power SRAM Design Using Half-Swing Pulse-Mode Techniques" IEEE JOURNAL OF SOLID-STATE CIRCUITS, VOL. 33, NO. 11, pp 1659-1671, NOVEMBER 1998. In the above-mentioned SRAM of the RRDV controlling method, in raising the voltage of the word line to select one row of a memory cell array, the power supply voltage supplied to the plurality of memory cells within the row is raised to a high voltage. At this time, a low voltage is supplied as a power supply voltage to the plurality of memory cells in the non-selected rows.

In an SRAM, data is latched with a flip-flop circuit disposed within each memory cell. For this reason, a power supply voltage must be supplied at all times to the non-selected memory cells. In an SRAM of the RRDV controlling method, the low power consumption is realized by supplying to the non-selected memory cells a power supply voltage lower than the one supplied to the selected memory cells. However, an SRAM of the conventional RRDV controlling method raises a critical problem in the stability of stored data.

In an SRAM, a precharging period exists before a memory cell is accessed. Namely, before the memory cell is accessed, the bit line connected to the memory cell is precharged to a high potential. This precharging process is carried out usually with the use of a high voltage which is the high power supply voltage supplied to the memory cell.

On the other hand, the power supply line which supplies the power supply voltage to the memory cells and the word line which selects the memory cells each have a certain degree of wiring length, whereby a signal delay occurs in correspondence with a parasitic capacitance and a parasitic resistance associated with each. Moreover, the delay time in the power supply line may not be the same as the delay time in the word line. Therefore, it may not happen that, at the time of accessing a memory cell, at all the positions of the power supply line and the word line, first the voltage of the power supply line rises to the high voltage, and then the voltage of the word line rises to the voltage corresponding to the selected state and, at the time of non-access to the memory cell, first the voltage of the word line falls to the voltage corresponding to the non-selected state, and then the voltage of the power supply line falls to the low voltage. Therefore, in an SRAM of the conventional RRDV controlling method, during the precharging period in changing from the non-access state to the access state, the word line voltage may be raised to be high before the power supply voltage supplied to the memory cells is raised.

FIG. 1 shows one example of the relationship between a static noise margin (SNM) of a memory cell in a non-selected state and the word line voltage in an SRAM by a conventional RRDV controlling method. Here, the value of the power supply voltage VDDL supplied to the memory cells in the non-selected state is, for example, 0.25V. FIG. 2 shows one example of the voltages Vin, Vout (Vin and Vout are voltages of the storage nodes N1, N2 of a later-mentioned flip-flop circuit of FIG. 4) at one pair of input and output nodes of a flip-flop circuit within a memory cell when the voltage of the word line is set to be 0.00, 0.25, and 0.30V. Here, the characteristics shown in FIG. 2 are generally known as a Butterfly curve. SNM1, SNM2, and the like in FIG. 2 correspond to SNM of FIG. 1.

As will be clear from FIGS. 1 and 2, when the word line voltage rises in a non-selected memory cell to which the low voltage is supplied as a power supply voltage, the static noise margin decreases, thereby inconveniently leading to destruction of the cell data.

BRIEF SUMMARY OF THE INVENTION

Thus, an object of the present invention is to provide an SRAM having an RRDV controlling method that can prevent destruction of cell data by preventing decrease in the static noise margin.

According to one aspect of the present invention, there is provided a static random access memory comprising: a memory cell array having a plurality of memory cells arranged in a matrix form; a plurality of word lines each connected in common to the plurality of memory cells arranged in each row of the memory cell array; a plurality of power supply lines each connected in common to the plurality of memory cells arranged in each row of the memory cell array for supplying a power supply voltage to the plurality of memory cells; and a plurality of power supply line/word line control circuits connected to the plurality of word lines and the plurality of power supply lines respectively, wherein, in accessing the plurality of memory cells row by row, the power supply line/word line control circuits raise a voltage of a corresponding power supply line among the plurality of power supply lines and, after the voltage of the power supply line reaches a first voltage at all positions, start activation of the word line, whereas, in turning from an access state to a non-access state, the power supply line/word line control circuits inactivate the word line and, after the voltage of the word line changes to a voltage corresponding to an inactivated state at all positions, change the voltage of the power supply line to a second voltage which is lower than the first voltage.

DETAILED DESCRIPTION OF THE INVENTION

Hereinafter, the present invention will be described in detail by way of examples with reference to the attached drawings.

Figure 1:
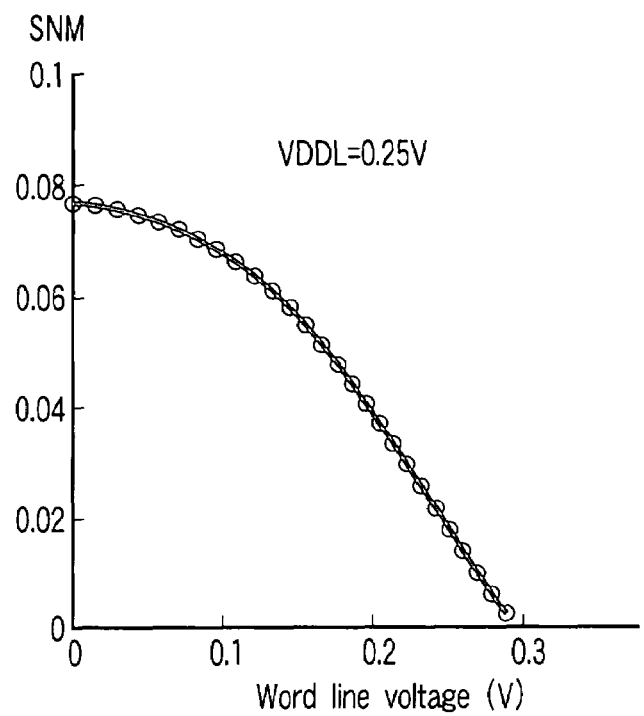
FIG. 1 is a characteristic diagram showing one example of the relationship between the static noise margin of a memory cell in a non-selected state and the word line voltage in an SRAM by a conventional RRDV controlling method.
Figure 2:
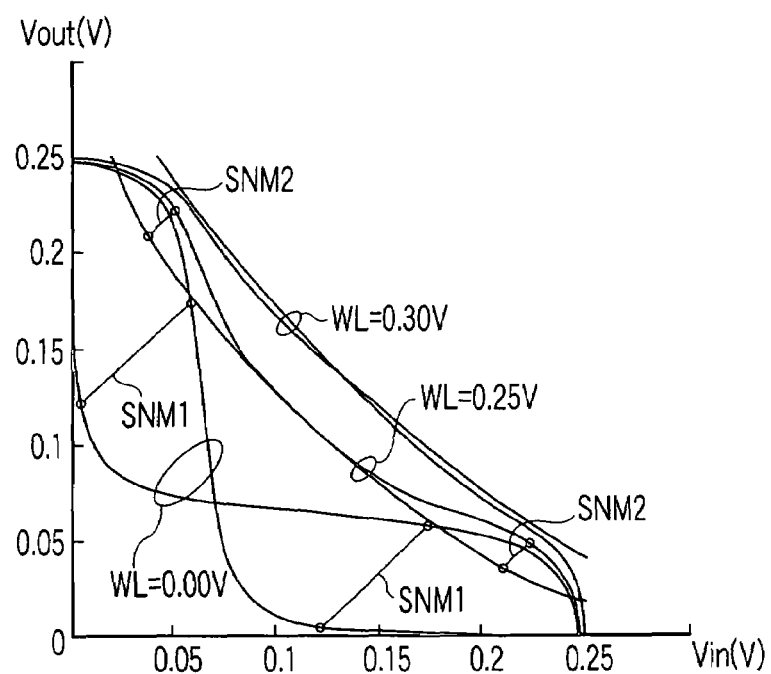
FIG. 2 is a characteristic diagram showing one example of the voltages at one pair of input and output nodes of a flip-flop circuit in a memory cell of an SRAM by a conventional RRDV controlling method.
Figure 3:
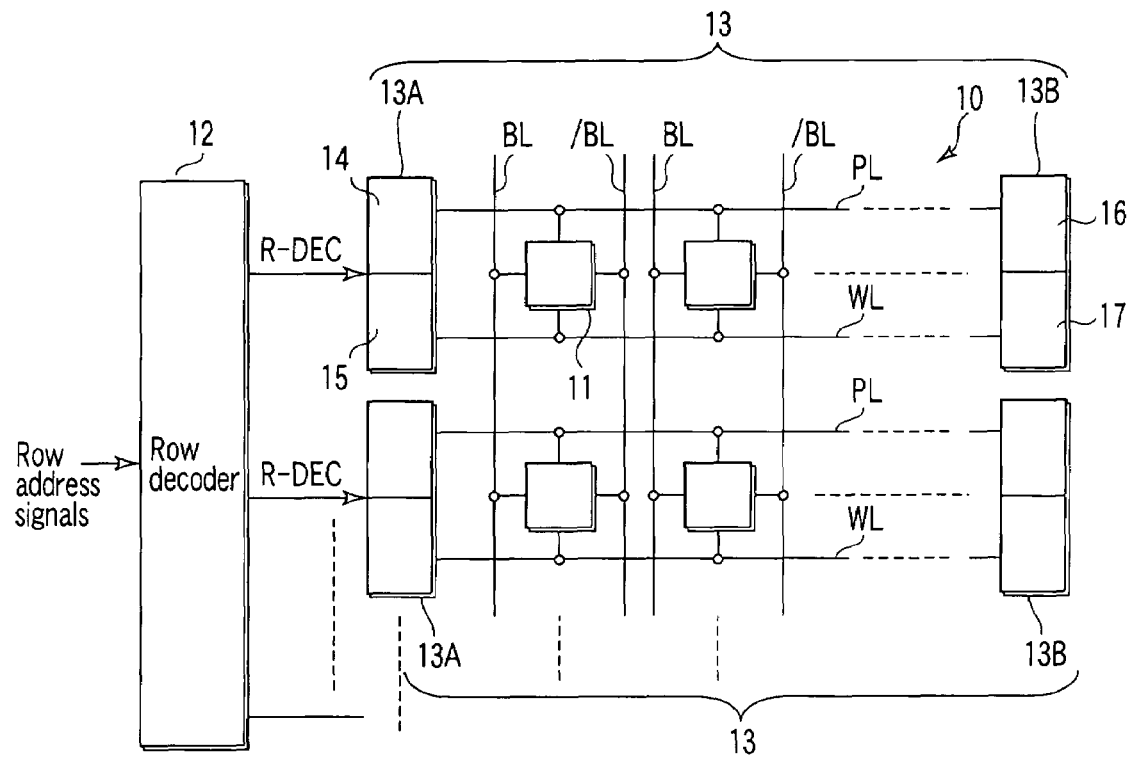
FIG. 3 is a block diagram showing a circuit construction of a memory cell array of an SRAM by an RRDV controlling method according to one embodiment of the present invention.

FIG. 3 shows a circuit construction of a memory cell array of an SRAM by an RRDV controlling method according to one embodiment of the present invention. A memory cell array 10 is provided with a plurality of memory cells 11 arranged in a matrix form. Among the plurality of memory cells 11, a plurality of memory cells 11 arranged in each row are connected in common to one corresponding word line WL among a plurality of word lines WL. Similarly, the plurality of memory cells 11 arranged in each row are connected in common to one corresponding power supply line PL among a plurality of power supply lines PL. Among the plurality of memory cells 11, a plurality of memory cells 11 arranged in each column are connected in common to one corresponding pair of bit lines BL, /BL among plural pairs of bit lines BL, /BL.

A row decoder 12 activates any one decoding signal out of a plurality of decoding signals R-DEC in correspondence with row address signals. The plurality of decoding signals R-DEC that are output from the row decoder 12 are supplied to a plurality of power supply line/word line control circuits 13 provided in correspondence with the plurality of power supply lines PL and the plurality of word lines WL. These power supply line/word line control circuits 13 include first power supply line/word line control circuits 13A disposed at one end of the power supply line PL and the plurality of word lines WL and second power supply line/word line control circuits 13B disposed at the other end of the power supply line PL and the plurality of word lines WL. Further, each of the first power supply line/word line control circuits 13A includes a first driving circuit 14 which drives the corresponding power supply line and a second driving circuit 15 which drives the corresponding word line. Each of the second power supply line/word line control circuits 13B includes a first detecting circuit 16 which detects the voltage of the corresponding power supply line and a second detecting circuit 17 which detects the voltage of the corresponding word line.

Figure 4:
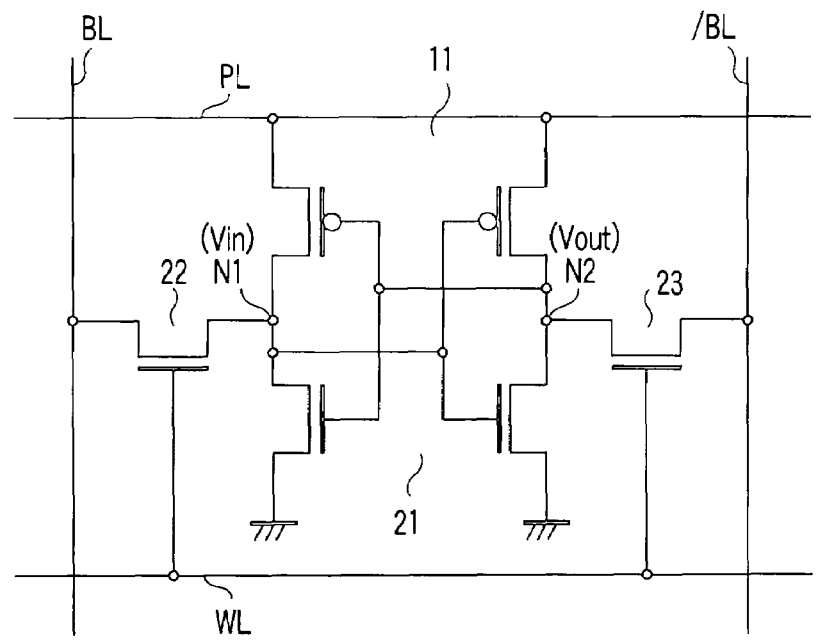
FIG. 4 is a circuit diagram showing a detailed construction of the memory cell in FIG. 3.

FIG. 4 shows one example of a detailed circuit construction of the memory cell 11 in FIG. 3. Each memory cell 11 includes a flip-flop circuit 21 for storing data connected between the power supply line PL and the node of the ground voltage, a transistor 22 of NMOS type for a transfer gate whose current path between the source and the drain is connected between one storage node N1 of the flip-flop circuit 21 and one bit line BL and whose gate electrode is connected to the word line WL, and a transistor 23 of NMOS type for a transfer gate whose current path between the source and the drain is connected between the other storage node N2 of the flip-flop circuit 21 and the other bit line /BL and whose gate electrode is connected to the word line WL.

The flip-flop circuit 21 is constructed, for example, with mutual cross-connection of the inputs and outputs of two inverters made of transistors of PMOS type and NMOS type, respectively.

Figure 5:
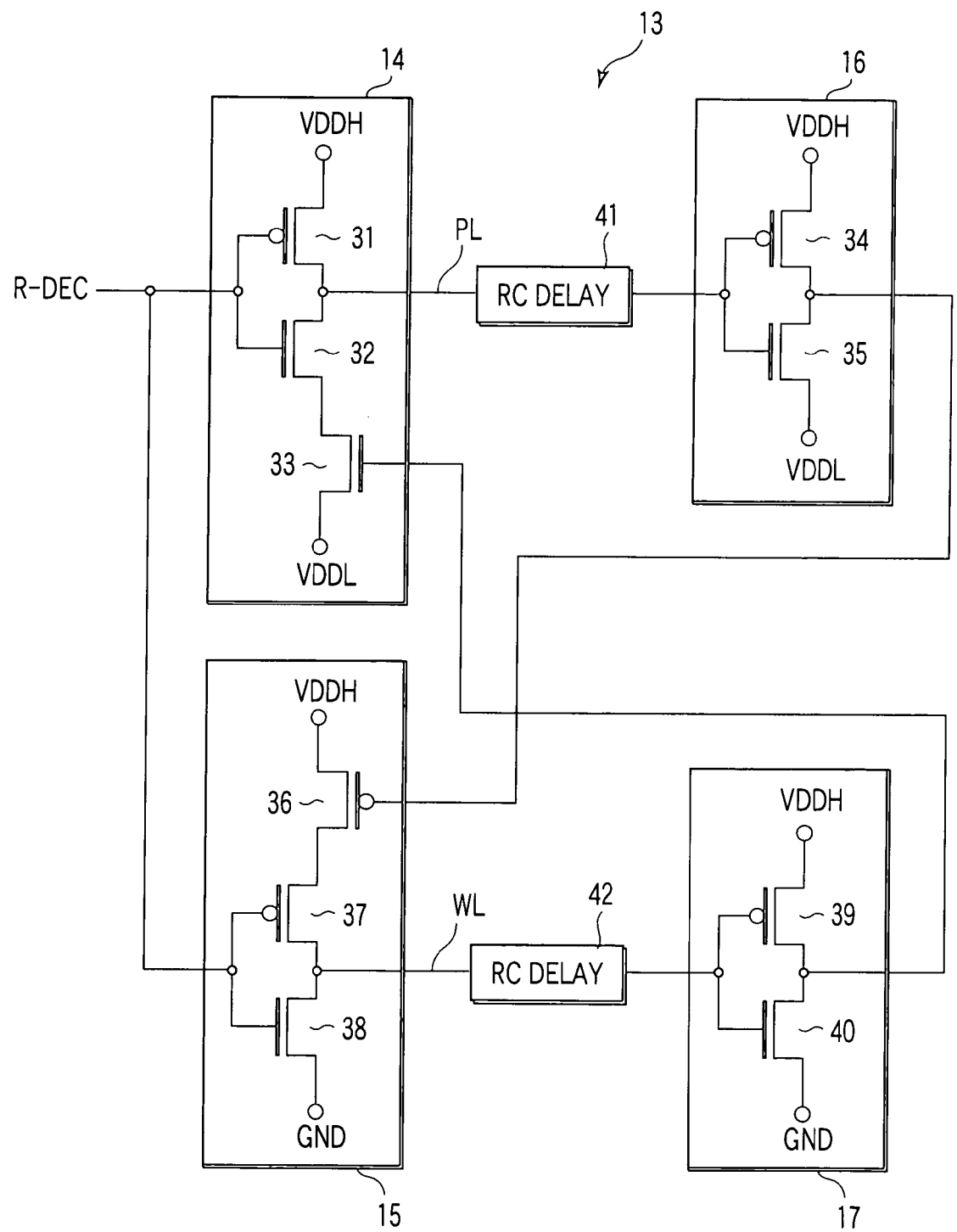
FIG. 5 is a circuit diagram showing a detailed construction of a power supply line/word line control circuit shown in FIG. 3.

FIG. 5 shows one example of a detailed circuit construction of the power supply line/word line control circuit 13 shown in FIG. 3. The first driving circuit 14 has a transistor 31 of PMOS type whose current path between the source and the drain is connected between a supply node of a high voltage VDDH and one end of the power supply line PL and whose gate electrode receives an input of the decoding signal R-DEC that is output from the row decoder 12 in FIG. 3, a transistor 32 of NMOS type whose current path between the source and the drain is inserted between the power supply line PL and the supply node of a low voltage VDDL and whose gate electrode receives an input of the decoding signal R-DEC, and a transistor 33 of NMOS type whose current path between the source and the drain is connected between the power supply line PL and the supply node of the low voltage VDDL in series with the current path of the transistor 32 and whose gate electrode receives an input of the detection signal of the second detecting circuit 17.

The first detecting circuit 16 has a transistor 34 of PMOS type and a transistor 35 of NMOS type whose current paths between the source and the drain are connected in series between the supply node of the high voltage VDDH and the supply node of the low voltage VDDL and whose gate electrodes are connected to the other end of the power supply line PL. A detection signal is output from the series connection node of the two transistors 34, 35.

The second driving circuit 15 has a transistor 36 of PMOS type whose current path between the source and the drain is inserted between the supply node of the high voltage VDDH and one end of the word line WL and whose gate electrode receives an input of the detection signal of the first detecting circuit 16, a transistor 37 of PMOS type whose current path between the source and the drain is connected between the supply node of the high voltage VDDH and one end of the word line WL in series with the current path of the transistor 36 and whose gate electrode receives an input of the decoding signal R-DEC, and a transistor 38 of NMOS type whose current path between the source and the drain is connected between one end of the word line WL and the supply node of the ground voltage GND and whose gate electrode receives an input of the decoding signal R-DEC.

The second detecting circuit 17 has a transistor 39 of PMOS type and a transistor 40 of NMOS type whose current paths between the source and the drain are connected in series between the supply node of the high voltage VDDH and the supply node of the ground voltage GND and whose gate electrodes are connected to the other end of the word line WL. A detection signal is output from the series connection node of the two transistors 39, 40.

Here, the low voltage VDDL is a voltage lower than the high voltage VDDH, and the low voltage VDDL is a voltage higher than zero. As one example, the low voltage VDDL is 0.25V, and the high voltage VDDH is 1V. Also, it is assumed that the activated level ("0" level) of the decoding signal R-DEC is zero which is equal to the GND level, and that the inactivated level ("1" level) is 1V which is equal to the VDDH level.

The power supply line PL causes a delay (RC delay) to the signal transmitted therethrough in correspondence with the parasitic capacitance and the parasitic resistance associated with the wiring line thereof. For convenience, this delay is represented by a delay circuit 41 which is inserted in the middle of the power supply line PL. Similarly, the word line WL causes a delay (RC delay) to the signal transmitted therethrough in correspondence with the parasitic capacitance and the parasitic resistance associated with the wiring line thereof. For convenience, this delay is represented by a delay circuit 42 which is inserted in the middle of the word line WL.

Next, an operation of the SRAM constructed as shown above will be described. First, in order to select one row from among a plurality of rows in the memory cell array 10 in FIG. 3, the decoding signal R-DEC of the row decoder 12 is activated ("0" level). By this, the transistor 31 of the first driving circuit 14 is turned on, and the transistor 32 is turned off. Therefore, via the transistor 31, the high voltage VDDH is output to one end of the power supply line PL. Since a signal delay occurs in the power supply line PL as described above, the signal voltage transmitted on the power supply line PL rises sequentially with the delay as the distance from the first driving circuit 14 gets larger. When the signal voltage at the other end of the power supply line PL reaches the high voltage VDDH, this is detected by the first detecting circuit 16, and a detection signal of the VDDL level is output.

On the other hand, when the decoding signal R-DEC is activated, the transistor 37 in the second driving circuit 15 is turned on, and the transistor 38 is turned off. However, since the detection signal of the first detecting circuit 16 is still at the "1" level immediately after the decoding signal R-DEC is activated, the transistor 36 in the second detecting circuit 15 is in an off state, and the word line WL is not driven. When the signal voltage of the corresponding power supply line PL reaches the high voltage VDDH at all the positions and this is detected by the first detecting circuit 16 to let a detection signal of the VDDL level be output from the first detecting circuit 16, the transistor 36 in the second driving circuit 15 is turned on, whereby the high voltage VDDH is output to one end of the word line WL through the transistors 36, 37. Since a signal delay occurs in the word line WL as described above, the signal voltage transmitted on the word line WL rises sequentially with the delay as the distance from the second driving circuit 15 gets larger. When the signal voltage at the other end of the word line WL reaches the high voltage VDDH, this is detected by the second detecting circuit 17, and a detection signal of the "0" level (0V) is output.

Thus, in turning a non-selected memory cell into a selected state, the word line voltage rises after the high voltage VDDH is supplied to all the memory cells 11 within the same row. Therefore, no inconvenience occurs such that the static noise margin of each memory cell decreases to destroy the cell data.

Next, when the decoding signal R-DEC is deactivated ("1" level), the transistor 37 in the second driving circuit 15 is turned off, and the transistor 38 is turned on. Therefore, the ground voltage GND is output to one end of the word line WL through the transistor 38. Since a signal delay occurs in the word line WL as described above, the signal voltage transmitted on the word line WL falls sequentially with the delay as the distance from the second driving circuit 15 gets larger. When the signal voltage at the other end of the word line WL reaches the ground voltage GND, this is detected by the second detecting circuit 17, and a detection signal of the "1" level is output.

On the other hand, when the decoding signal R-DEC is inactivated, the transistor 31 in the first driving circuit 14 is turned off, and the transistor 32 is turned on. However, since the detection signal of the second detecting circuit 17 is still at the "0" level immediately after the decoding signal R-DEC is deactivated, the transistor 33 in the first driving circuit 14 is in an off state, and the low voltage VDDL is not output to the power supply line PL. When the signal voltage of the corresponding word line WL reaches the ground voltage GND at all the positions and this is detected by the second detecting circuit 17 to let a detection signal of the "1" level be output from the second detecting circuit 17, the transistor 33 in the first driving circuit 14 is turned on, whereby the low voltage VDDL is output to one end of the power supply line PL through the transistors 32, 33. The signal voltage transmitted on the power supply line PL falls sequentially with the delay as the distance from the first driving circuit 14 gets larger. When the voltage at the other end of the power supply line PL reaches the low voltage VDDL, this is detected by the first detecting circuit 16, and a detection signal of the "1" level is output.

Thus, in turning a memory cell from a selected state to a non-selected state, the voltage of the power supply line PL within the same row is lowered from the high voltage VDDH to the low voltage VDDL after the signal voltage of the word line WL falls to the ground voltage GND at all the positions. Therefore, no inconvenience occurs such that the static noise margin of each memory cell decreases to destroy the cell data.

Figure 6:
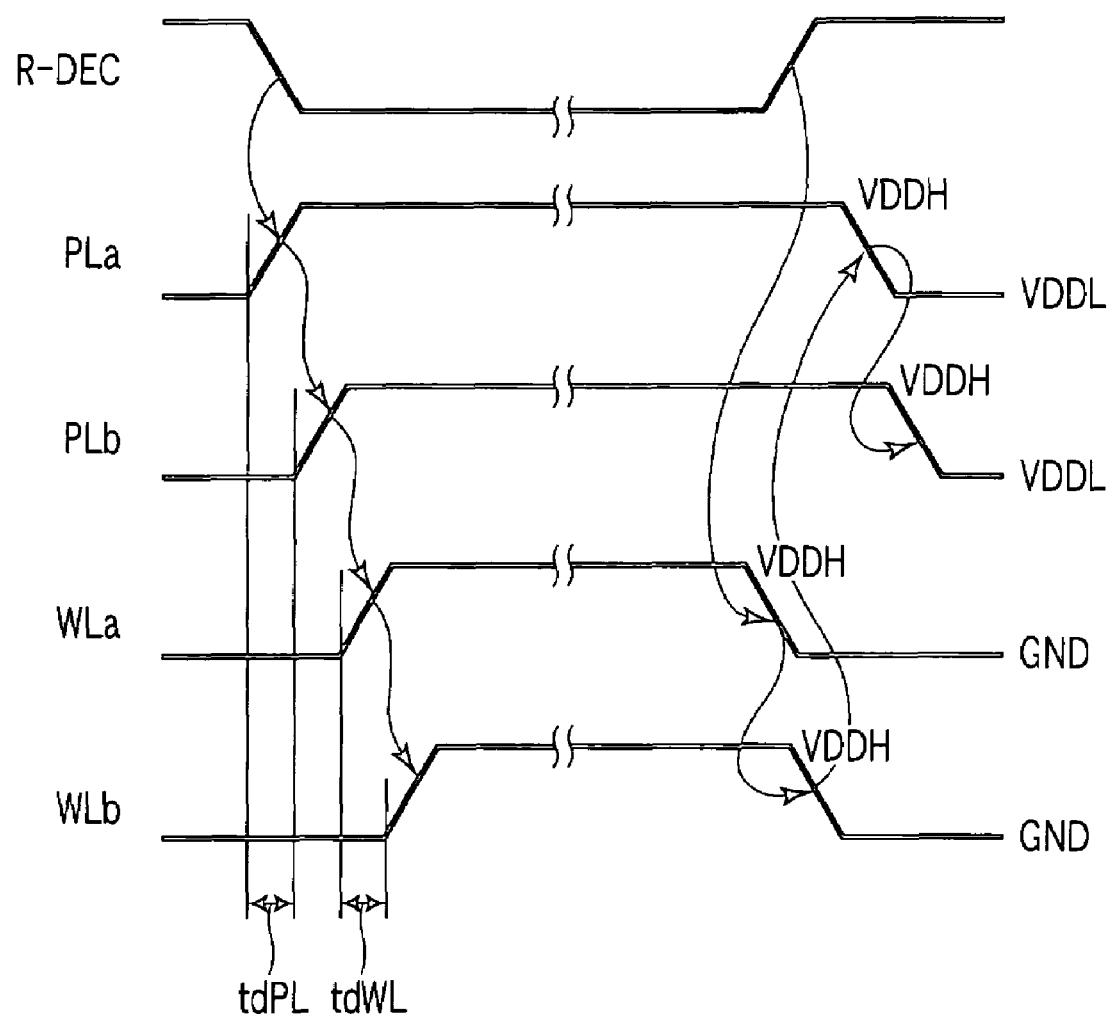
FIG. 6 is a waveform diagram showing change of the signal voltage in the power supply line and in the word line in FIG. 3.

FIG. 6 shows change in the power supply line voltage PLa and the word line voltage WLa at an end of the power supply line PL and the word line WL on the first and second driving circuits 14, 15 side and in the power supply line voltage PLb and the word line voltage WLb at an end of the power supply line PL and the word line WL on the first and second detecting circuits 16, 17 side. As illustrated, in accessing a plurality of memory cells row by row, the voltage of the power supply line PL rises and, after the voltage of the power supply line PL reaches the high voltage VDDH at all the positions, the activation of the word line WL is started to raise the voltage of the word line WL. In contrast to the above, in turning from an access state to a non-access state, the word line WL is deactivated to lower the voltage of the word line WL and, after the voltage of the word line WL changes to the ground voltage GND at all the positions, the voltage of the power supply line PL changes to the low voltage VDDL. In FIG. 6, the time difference tdPL between the rise timing of the power supply line voltage PLa and the rise timing of the power supply line voltage PLb corresponds to the delay time generated between the input and output signals of the delay circuit 41 in FIG. 5. Also, the time difference tdWL between the rise timing of the word line voltage WLa and the rise timing of the word line voltage WLb corresponds to the delay time generated between the input and output signals of the delay circuit 42 in FIG. 5.

Here, it goes without saying that the present invention is not limited to the above-described examples, and various modifications can be made. For example, in the above examples, description has been made on a case where the power supply line/word line control circuit 13 has a construction such as shown in FIG. 3. In short, however, the power supply line/word line control circuit 13 may have any construction as long as it functions in such a manner that, in accessing a plurality of memory cells row by row, the voltage of the power supply line is raised and, after the voltage of the power supply line reaches the first voltage (for example, VDDH) at all the positions, the activation of the word line is started and, in turning from an access state to a non-access state, the word line is deactivated and, after the voltage of the word line changes to the voltage corresponding to the deactivated state (for example, 0V) at all the positions, the voltage of the power supply line is changed to the second voltage (VDDL) which is lower than the first voltage (VDDH).

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A static random access memory comprising:
   a memory cell array having a plurality of memory cells arranged in a matrix form;
   a plurality of word lines each connected in common to the plurality of memory cells arranged in each row of the memory cell array;
   a plurality of power supply lines extending parallel to the plurality of word lines, each of the plurality of power supply lines being connected in common to the plurality of memory cells arranged in each row of the memory cell array and which supplies a power supply voltage to the plurality of memory cells; and
   a plurality of power supply line/word line control circuits connected to the plurality of word lines and the plurality of power supply lines respectively, wherein, in accessing the plurality of memory cells row by row, the power supply line/word line control circuits raise a voltage of a corresponding power supply line among the plurality of power supply lines, detect that the voltage of the power supply line at all positions reaches a first voltage, and after detecting that, start activation of the word line, whereas, in turning from an access state to a non-access state, the power supply line/word line control circuits deactivate the word line, detect that the voltage of the word line at all positions has been changed to a voltage corresponding to a deactivated state, and after detecting that, change the voltage of the power supply line to a second voltage which is lower than the first voltage.

2. The static random access memory according to claim 1, wherein the second voltage is a voltage higher than zero.

3. The static random access memory according to claim 1, wherein an activating voltage of the word line is a voltage equal to the first voltage.

4. The static random access memory according to claim 1, wherein the plurality of power supply line/word line control circuits each includes:
   a first driving circuit connected to one end of each one of the plurality of power supply lines, the first driving circuit receiving a control signal to access the plurality of memory cells row by row and, after the control signal is activated, outputting the first voltage to one end of each one of the plurality of power supply lines;
   a first detecting circuit connected to the other end of each one of the plurality of power supply lines, the first detecting circuit outputting a first detection signal by detecting that a voltage at the other end of each one of the plurality of power supply lines has reached the first voltage;
   a second driving circuit connected to one end of each one of the plurality of word lines and to the first detecting circuit, the second driving circuit receiving the control signal and outputting a voltage corresponding to an activated state of each one of the plurality of word lines to one end of each one of the plurality of word lines after the control signal is activated and the first detection signal is supplied, the second driving circuit outputting a voltage corresponding to a deactivated state of each one of the plurality of word lines to one end of each one of the plurality of word lines after the control signal is deactivated; and
   a second detecting circuit connected to the other end of each one of the plurality of word lines, the second detecting circuit outputting a second detection signal by detecting that a voltage at the other end of each one of the plurality of word lines has reached a voltage corresponding to a deactivated state of each one of the plurality of word lines, and
   the first driving circuit is further connected to the second detecting circuit and outputs the second voltage to one end of each one of the plurality of power supply lines in place of the first voltage after the second detection signal is supplied.

5. The static random access memory according to claim 4, wherein the first driving circuit includes:
   a first transistor of PMOS type whose cuirent path is connected between a supply node of the first voltage and one end of each one of the plurality of power supply lines and whose gate electrode receives an input of the control signal;
   a second transistor of NMOS type whose current path is inserted between each one of the plurality of power supply lines and a supply node of the second voltage and whose gate electrode receives an input of the control signal; and
   a third transistor of NMOS type whose current path is connected between each one of the plurality of power supply lines and the supply node of the second voltage in series with the current path of the second transistor and whose gate electrode receives a detection signal of the second detecting circuit,
   the first detecting circuit includes:
   a fourth transistor of PMOS type and a fifth transistor of NMOS type whose current paths are connected in series between the supply node of the first voltage and the supply node of the second voltage and whose gate electrodes are connected to the other end of each one of the plurality of power supply lines, where the detection signal is output from a series connection node of the fourth and fifth transistors,
   the second driving circuit includes:
   a sixth transistor of PMOS type whose current path is inserted between a supply node of the first voltage and one end of each one of the plurality of word lines and whose gate electrode receives an input of the detection signal of the first detecting circuit;
   a seventh transistor of PMOS type whose current path is connected between the supply node of the first voltage and one end of each one of the plurality of word lines in series with the current path of the sixth transistor and whose gate electrode receives an input of the control signal; and
   an eighth transistor of NMOS type whose current path is connected between one end of each one of the plurality of word lines and a supply node of a ground voltage and whose gate electrode receives an input of the control signal, and
   the second detecting circuit includes:

a ninth transistor of PMOS type and a tenth transistor of NMOS type whose current paths are connected in series between the supply node of the first voltage and the supply node of the ground voltage and whose gate electrodes are connected to the other end of each one of the plurality of word lines, where the detection signal is output from a series connection node of the ninth and tenth transistors.

* * * * *

UNITED STATES PATENT AND TRADEMARK OFFICE
CERTIFICATE OF CORRECTION

PATENT NO. : 7,266,035 B2  Page 1 of 1
APPLICATION NO. : 11/205466
DATED : September 4, 2007
INVENTOR(S) : T. Sakurai et al.

It is certified that error appears in the above-identified patent and that said Letters Patent is hereby corrected as shown below:

| COLUMN | LINE | ERROR |
|---|---|---|
| 8 (Claim 5, | 25 line 3) | "cuirent" should read --current-- |

Signed and Sealed this

Tenth Day of June, 2008

JON W. DUDAS
*Director of the United States Patent and Trademark Office*